(12) United States Patent
Zenati et al.

(10) Patent No.: US 11,360,144 B2
(45) Date of Patent: Jun. 14, 2022

(54) DIRECT CURRENT CONTACTOR WEAR TRACKING

(71) Applicant: Saft America, Inc., Cockeysville, MD (US)

(72) Inventors: Ali Zenati, Jacksonville, FL (US); Christopher Thorpe, Jacksonville, FL (US); Theodore Brown, Jacksonville, FL (US)

(73) Assignee: Saft America, Inc., Cockeysville, MD (US)

( * ) Notice: Subject to any disclaimer, the term of this patent is extended or adjusted under 35 U.S.C. 154(b) by 376 days.

(21) Appl. No.: 16/585,995

(22) Filed: Sep. 27, 2019

(65) Prior Publication Data
US 2021/0096184 A1 Apr. 1, 2021

(51) Int. Cl.
G01R 31/327 (2006.01)
H01H 1/00 (2006.01)

(52) U.S. Cl.
CPC ..... G01R 31/3274 (2013.01); G01R 31/3275 (2013.01); H01H 1/0015 (2013.01)

(58) Field of Classification Search
None
See application file for complete search history.

(56) References Cited

U.S. PATENT DOCUMENTS

| 7,705,601 | B2 | 4/2010 | Zhou et al. | |
| 11,108,225 | B2* | 8/2021 | Fisher | H02M 7/003 |
| 2009/0168524 | A1* | 7/2009 | Golov | G11C 16/349 |
| | | | | 365/185.09 |
| 2015/0088361 | A1* | 3/2015 | Hartl | B60L 3/04 |
| | | | | 701/29.2 |
| 2016/0259007 | A1 | 9/2016 | Mair et al. | |
| 2018/0345813 | A1* | 12/2018 | Hackner | H02H 9/001 |
| 2019/0303283 | A1* | 10/2019 | McGlaughlin | G11C 16/08 |
| 2019/0370610 | A1* | 12/2019 | Batoukov | G06F 11/0793 |
| 2021/0042395 | A1* | 2/2021 | Canfield | H01R 13/00 |
| 2021/0096628 | A1* | 4/2021 | Zenati | H02J 7/0029 |

FOREIGN PATENT DOCUMENTS

| CN | 207098682 U | * | 3/2018 | ............... H02J 7/00 |
| CN | 108964569 A | * | 12/2018 | ............. H02P 29/00 |
| DE | 102012215190 A1 | | 2/2014 | |
| DE | 102014218927 A1 | | 3/2015 | |
| JP | 2007149458 | | 6/2007 | |
| JP | 2011233392 | | 11/2011 | |

* cited by examiner

Primary Examiner — Jermele M Hollington
(74) Attorney, Agent, or Firm — Sunstein LLP

(57) ABSTRACT

The present invention is notably directed to methods for estimating a degradation of an electronically controlled electro-mechanical switch. The methods comprise determining a change of state of the contactor. They also comprise, computing, for each determined change of state, a wear increment $W_I$ of the contactor by: identifying a wear coefficient using a mapping between a last measured current through the contactor and a current range associated with a given wear coefficient; computing the actual wear $W_N$ of the contactor by adding the computed wear increment $W_I$ to a former known wear $W_{I-1}$ of the contactor.

15 Claims, 6 Drawing Sheets

| Simplified Simulation | Amps |
|---|---|
| Severity Threshold 1 | 50 |
| Severity Threshold 2 | 100 |
| Severity Threshold 3 | 200 |
| Severity Threshold 4 | 400 |

FIG. 5

| Simplified Simulation | Wear Coefficient |
|---|---|
| Wear Severity 1 | 0.000001 |
| Wear Severity 2 | 1.66667E-06 |
| Wear Severity 3 | 0.00001 |
| Wear Severity 4 | 0.00005 |
| Wear Severity 5 | 0.000333333 |

FIG. 6

DIRECT CURRENT CONTACTOR WEAR TRACKING

FIELD

Embodiments of the invention relate in general to the field of electronically controlled electro-mechanical switches and more specifically to the estimation of their degradation.

BACKGROUND

Contactors are devices capable of conducting the energy in the system and interrupting that current as required. Their primary function is thus to conduct current and isolate to one portion of an energized system from another.

A DC electrified system with a power source and load typically comprises one or more circuit connection devices. These connection devices are DC contactors, specially designed electromechanical relays capable of conducting high current and high voltage. The normal function of these contactors is to complete the electrical circuit between the parts of the electrified system. The contactors are intended to act in fault conditions to interrupt current to prevent unsafe operation or damage to the system.

In some instances, the contactors may act to break current, typically in major fault conditions which require that current be interrupted to prevent unsafe operation of the electrical system. When the contactor makes or breaks the electrical connection with the load high currents can be present depending on the system conditions. They may also make current when initially connecting to the application load. When this occurs, it can result in significant damage to the contactors, depending on how much current is flowing during the event. This damage is due to arcing which occurs between the contacts of the contactor while it is transitioning between closed and open states.

This damage is cumulative, and even very low currents cause some damage that will eventually lead to the failure of the contactor either due to contact "welding" or a mechanical failure inside the contactor which disables the ability of the contactor to open/close the circuit. If a contactor fails in the electrical system, it can result in either unsafe operation if the contactor is unable to open or the system will be disabled and unable to function in the system. Indeed, the primary function of a DC contactor is to control the connection of the energy storage system to the application or load. A secondary function is to disconnect the energy storage system to prevent unsafe operation of the system.

This cumulative damage is well understood in the industry and contactors are typically rated for a specific number of make and break cycles at a rated current and voltage level. Contactors are typically well characterized by the manufacturer, and therefore planning the replacement of a contactor before a failure occurs is possible, allowing scheduled downtime and minimal impact to the application.

However, the ability to estimate the contactor wear can be difficult. For instance, it may involve measuring the impedance or voltage across the contacts directly, which has its own risks associated with the high voltages involved in the systems, and can be unreliable depending on the type of wear and mechanism of failure. Furthermore, the effects of unintended electrical switching are difficult to quantify.

Providing a reliable means of estimating the wear of a contactor increases the reliability of a system and allows for maintenance of components before a failure occurs, preserving the safety and availability of the electrical system. The robustness and reliability of the system is improved.

BRIEF SUMMARY OF THE INVENTION

According to a first aspect, the present invention is embodied as method for estimating a degradation of an electronically controlled electro-mechanical switch. Such method comprises:
 determining a change of state of a contactor;
 for each determined change of state, computing a wear increment $W_I$ of the contactor by identifying a wear coefficient using a mapping between a last measured current through the contactor and a current range associated with a given wear coefficient;
 computing the actual wear $W_N$ of the contactor by adding the computed wear increment $W_I$ to a former known wear $W_{I-1}$ of the contactor.

The method may comprise one or more of the followings:
 determining a change of state of the contactor further comprises detecting that a current change through the contactor occurred;
 in addition to the previous determining, determining a change of state of the contactor further comprises periodically monitoring the current through the contactor, thus forming a set of records of the current through the contactor.
 in addition to the previous determining, when a change of state is detected, determining from the set of records of current whether a current change through the contactor occurred, if a current change through the contactor occurred, recovering the last measured current through the contactor from the set of records of the current, and if no current change through the contactor occurred, determining that the wear coefficient is due to the mechanical operation of the contactor; and/or
 scaling the identified wear coefficient using a voltage across a power source; and/or
 before computing the actual wear $W_N$, retrieving the former known wear $W_{N-1}$ from a memory and after computing the actual wear $W_N$, storing the actual wear $W_N$ in the memory; and/or
 comparing the computed actual wear $W_N$ to a parameterizable threshold to determine if the actual wear $W_N$ of the contactor e an acceptable level;
 determining that the actual wear $W_N$ of the contactor exceeds an acceptable level and raising a contactor wear alarm; and/or
 in addition to the previous determining that the actual wear $W_N$ of the contactor excesses an acceptable level and raising a contactor wear alarm: if the actual wear $W_N$ of the contactor has an acceptable level, determining whether a contactor operation broken/made current occurred for the contactor, determining the wear coefficient using the mapping; or if the contactor did not break/make current, determining a wear coefficient the wear coefficient is due to the mechanical operation.

According to another aspect, the invention is embodied as a contactor management system for estimating a degradation of an electronically controlled electro-mechanical switch. The contactor management system comprises:
 a contactor connectable to a power supply;
 a processing circuitry operatively coupled to a data storage memory, the data storage memory comprising instructions to configure the processor to:
  determine a change of state of the contactor;
  for each determined change of state, compute a wear increment $W_I$ of the contactor by:

identify a wear coefficient using a mapping between a last measured current through the contactor and a current range associated with a given wear coefficient;

compute the actual wear $W_N$ of the contactor by adding the computed wear increment $W_I$ to a former known wear $W_{I-1}$ of the contactor.

The contactor management system may comprise one or more of the followings:

instructions to configure the processor to detect that a current change through the contactor occurred; or in addition to instructions to configure the processor to detect that a current change through the contactor occurred, a sensor for monitoring a current through the contactor and wherein the instructions further comprise instructions to configure the processor to periodically obtain values of the current through the contactor and forming a set of records of the current through the contactor; or in addition to instructions to configure the processor to detect that a current change through the contactor occurred and to the sensor, instructions to configure the processor to when a change of state is detected, determine from the set of records of current whether a current change through the contactor occurred; if a current change through the contactor occurred, recover the last measured current through the contactor from the set of records of the current; and if no current change through the contactor occurred, determining that the wear coefficient is due to the mechanical operation of the contactor; and/or instructions to configure the processor to scale the identified wear coefficient using the voltage across the contactor; and/or instructions to configure the processor to before computing the actual wear $W_N$, retrieve the former known wear $W_{N-1}$ from the data storage memory, and after computing the actual wear $W_N$, store the actual wear $W_N$ in the data storage memory; or in addition to the instructions to configure the processor to before computing the actual wear $W_N$, retrieve the former known wear $W_{N-1}$ from the data storage memory, and after computing the actual wear $W_N$, store the actual wear $W_N$ in the data storage memory, instructions to configure the processor to compare the computed actual wear $W_N$ to a parameterizable threshold to determine if the actual wear $W_N$ of the contactor excesses an acceptable level; or in addition to the instructions to configure the processor to before computing the actual wear $W_N$, retrieve the former known wear $W_{N-1}$ from the data storage memory and after computing the actual wear $W_N$, store the actual wear $W_N$ in the data storage memory, and in addition to the instructions to configure the processor to compare the computed actual wear $W_N$ to a parameterizable threshold to determine if the actual wear $W_N$ of the contactor excesses an acceptable level, instructions to configure the processor to determine that the actual wear $W_N$ of the contactor excesses an acceptable level, and if the actual wear $W_N$ of the contactor excesses an acceptable level, raise a contactor wear alarm, or if the actual wear $W_N$ of the contactor has an acceptable level, determining whether a contactor operation broken/made current occurred for the contactor: if the contactor operation broken/made current, determining the wear coefficient using the mapping, or if the contactor did not break/make current, determining a wear coefficient the wear coefficient is due to the mechanical operation.

According to another aspect, the invention can be embodied as a computer program product having program instructions that cause a computerized system to perform the above methods.

The computer program can be stored on the data storage memory of contactor management system for causing the processing circuitry to perform the above methods.

According to a further aspect, it is proposed a non-transitory computer-readable data storage medium comprising the above computer program.

Systems, products and methods embodying the present invention will now be described, by way of non-limiting examples, and in reference to the accompanying drawings.

BRIEF DESCRIPTION OF SEVERAL VIEWS OF THE DRAWINGS

FIG. 5 shows an example of current ranges used to generate a contactor wear coefficient;

FIG. 6 shows an example of wear coefficients associated with the current ranges in FIG. 4.

Similar or functionally similar elements in the figures have been allocated the same reference signs if not otherwise indicated.

DETAILED DESCRIPTION OF EMBODIMENTS OF THE INVENTION

As present inventors have realized, the tracking of the degradation of an electronically controlled electro-mechanical switch can be estimated by accumulating the degradation over successive changes in state of the switch. This can be automatically performed by tracking the damage that occurs to the contactor at each make or break cycle by using the manufacturer data in order to establish current ranges and associated wear coefficients. The actual wear associated with any operation (opening or closing) of the switch is calculated by mapping the change in current to one of the several predefined ranges. The contactor wear increment due to a contactor state change can be added to an existing contactor wear value, thus forming a new wear estimate that can be stored in a memory. Thus, the tracking of the degradation of the switch can be done by estimating the degradation associated with a change in state and by accumulating the degradation over successive changes in state.

The present inventors have also realized that it may be possible to quantify the effect of unintended electrical switching by determining if the contactor is responsible for a change in the measured current. A contactor operation may be in progress when a contractor's requested state does not match its detected state. This inconsistency may be possible because the request initiates from an electronic device with a very small delay to a mechanical one with a longer delay. Thus, when the contactor completes its opening/closing operation, the contactor detected state may be not consistent with the requested state. Any appreciable current change at this point may be recovered from a log of current values the microcontroller maintains and used to generate the contactor wear coefficient and subsequent wear increment obtained by estimating the degradation associated with a change in state and by accumulating the degradation over successive changes in state.

Figure 2:
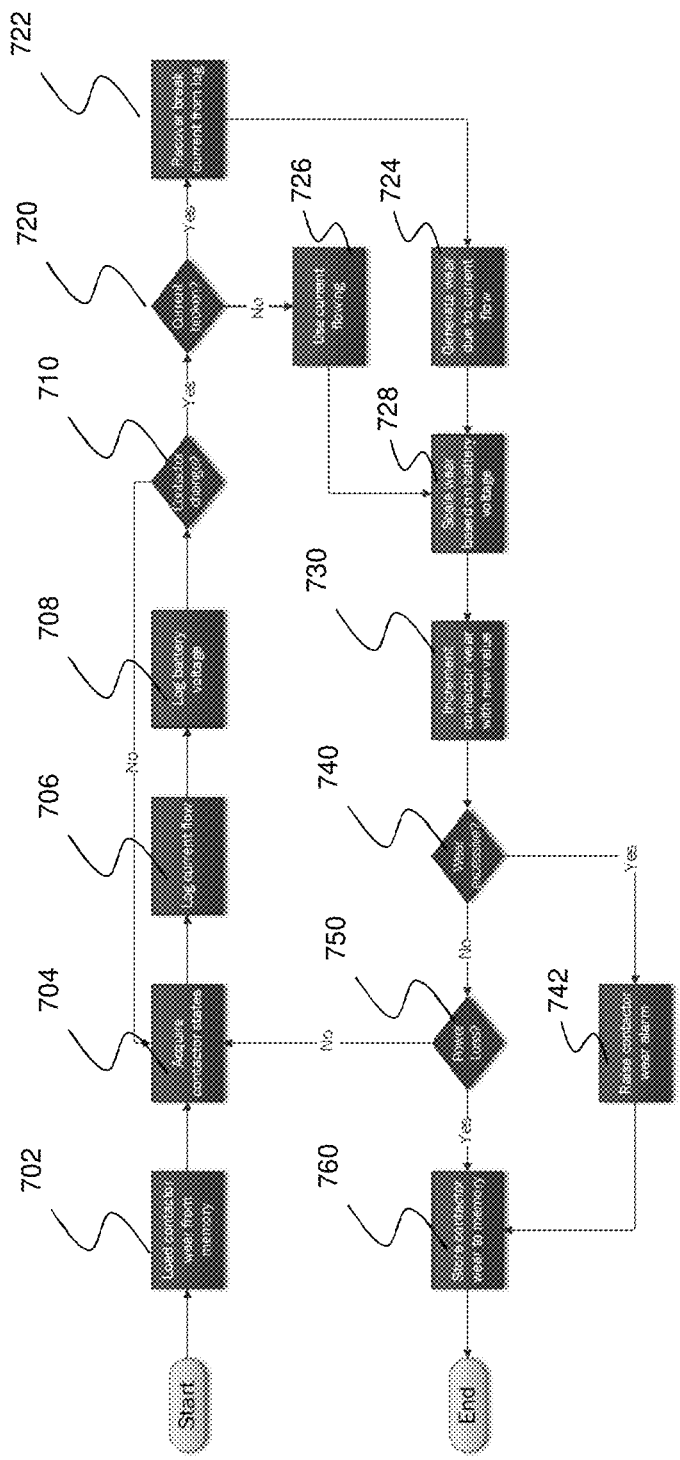
FIG. 2 shows is an example of a method for estimating a degradation of an electronically controlled electro-mechanical switch.

Building on this idea, a general aspect of the invention is now described, which concerns a method for estimating a degradation of an electronically controlled electro-mechanical switch, in reference to FIG. 2. Estimating the wear is critical to improving system reliability and safety by tracking damaging events and indicating that a contactor will dissipate more power under normal use than intended and have reduced current breaking capability. In the following, the terms contactor and switch are used interchangeably.

Basically, the method starts with determining 710 a change of state of the contactor. The determination of the change of the state may be performed by, but is not limited to, using the contactor's auxiliary contacts, using an electronic circuit, and/or using a microcontroller. A closed to an open transition is referred to break transition and an open to closed transition is referred to make transition. The determination 710 may be also referred to as a detection.

In examples, the change is determined upon acquiring contactor's state information 704 from the contactor's auxiliary contacts. The contactor's auxiliary contacts are contactors that are electrically isolated from the contactor. They are usually used to provide a signal to an outside equipment that monitors the contactor, e.g. electronic circuit and/or the microcontroller.

In examples, the change is determined upon acquiring contactor's state information 704 by measuring the voltage or resistance across the primary contacts in the contactor.

In examples, the change is determined upon acquiring contactor's state information 704 from the electronic circuit may be used for managing the contactor and/or receiving the signal provided by the contactor's auxiliary contacts. The electronic circuit that manages the contactor knows at any time the last state it ordered to the contactor.

In examples, the change is determined upon acquiring contactor's state information 704 from the microcontroller may be used for managing the electronic circuit. The microcontroller is thus the device that sends open/close orders to the contactor (it acts as direct manager of the contactor) or to the electronic circuit that manages the contactor. The microcontroller knows at any time the contactor's intended state it sent to the contactor. The contactor's intended state can be also referred to as contactor's commanded state.

There may be an inconsistency between the contactor's acquired state and the contactor's intended state because of signal propagation and mechanical movement, e.g. sent by the electronic circuit, and its execution, e.g. mechanical movement of the contactor. For instance, the contactor may be considered as opened by the BMS while it is in fact still closed. This inconsistency may cause a modification to the estimated contactor wear. The determination of the change of state requested may be obtained upon the detection that a change of the current through the contactor occurred. The detection thus relies on a measure of the current through the contactor and a change of the current indicates that a change of the state occurred.

In examples, during normal operation of the contactor, the current flowing through the contactor may be periodically monitored at a given frequency to accurately capture the state of true current flow in the circuit, and therefore through the contactor. In an example, the state of the contactor is acquired at the same frequency as current flowing through the contactor from the current sensor. The measurements do have a frequency based on the characteristics, e.g. of the electronic control circuitry. The monitoring of the contactor state and the current flowing in the system can both have a specific frequency and may be synchronous or asynchronous.

In examples, the periodical monitoring 706 of the current through the contactor may be stored in a memory, thus forming a so-called log of the current flow through the contactor. Interestingly, when an acquired contactor's state information is received, it is possible to determine if the contactor was responsible for a change in current by examining the log of the most recent samples of current through the system. By this mechanism it is possible to determine when a contactor performs an operation that will cause wear to the contacts, and estimate how much wear is accrued based on the amount of current flowing at the time of the operation. This is exemplified in the example of FIG. 2 where contactors states are acquired 704, the current flowing though the contactor periodically monitored 706, and the contactor changes 710 confirmed or not by detecting whether a current change through the contactor occurred.

Still in reference to FIG. 2, when a contactor change is detected, a wear increment (noted $W_I$) of the contactor is computed (730). The wear increment $W_I$ represents the actual wear of the contactor associated with the last operation of the contactor.

The wear increment is computed by identifying a wear coefficient. The wear coefficient is identified using a mapping between the last measured current through the contactor and a current range associated with a given wear coefficient. The wear coefficients thus characterize a contactor damage incurred while changing state. To characterize the damage of a contactor state change, testing may consist of exposing contactors to successive opening/closing events at each current until the impedance of the contactor increased by a given value, e.g. 0.1 mOhm. Testing may also consist of exposing contactors to successive opening/closing events at each current and voltage until the impedance of the contactor increased by the given value. The wear coefficient may then be normalized by the number of operations need to induce this change.

FIGS. 5 and 6 illustrate an example of mapping in which five current ranges are used to map a contactor open or closing event to a contactor wear increment. In FIG. 5, each current range (0-50 amps, 50-100 amps, 100-200 amps, 200-400 amps) is associated with a severity threshold, and these current ranges are those that were used for generating contactor wear coefficients. FIG. 6 shows wear coefficients associated with the current ranges of FIG. 5. It is to be understood that the wear coefficient identification may rely on one or more tables similar to those represented on FIGS. 5 and 6.

The testing used for characterizing the damage may rely on both current and voltage. In this case, the computation of the wear increment further comprises an operation of scaling 728 the wear coefficient using a voltage across a power source.

The actual wear of the contactor, noted $W_N$, is computed by adding the computed wear increment $W_I$ to a former known wear $W_{N-1}$ of the contactor. The actual wear represents the accumulation (or an addition) of the past degradations of the switch, including the last one represented by the wear increment $W_I$.

The latest known value $W_{N-1}$ may be computed the same manner as the actual wear of the contactor. In examples of the method, the latest known value $W_{N-1}$ may equal to zero. For instance, this may be the case if the contactor is a new contactor.

In examples of the method, at least the latest known value $W_{N-1}$ may be stored 760 in a data storage memory for being used for the next computation. The memory may be a non-volatile memory. The non-volatile memory may be the non-volatile memory of the microcontroller.

In examples of the method, the latest known value $W_{N-1}$ stored in the memory is deleted and replaced by the latest value $W_I$ once computed. As a result of this operation, the value $W_I$ becomes the latest known value $W_{N-1}$. This can be noted $W_{N-1} = W_N$.

In examples, the former known wear $W_{N-1}$ is retrieved 702 from the memory before computing the actual wear $W_N$. The retrieval may be performed at any time of the method but has to be available for the computation 730. It is to be understood that the wears $W_{N-1}$, $W_1$ are values.

In example, the result of the computation 730 may depend on a determination 720 of current change through the contactor. When a change of state is detected, one determines from the set of records of current whether a contactor operation changed the current flowing through contactor— thus, a current change through the contactor occurred—. The set of records is a buffer of recent current measurements. This allows estimating the current flowing through the electro-mechanical switch when a change in state event occurs. Two cases are possible: (i) the first result of the determination is that the current flowing through the contactor is not made/broken (that is, made or broken); (ii) the second result of the determination is that the current flowing through the contactor is made/broken (that is, made or broken).

If (i), then the value of the current flowing through the contactor is used 726 for the operation 730, that is for computing the actual contactor wear for current not being made or broken. If (ii), then the log of the current flow through the contactor can be consulted 722 in order to recover the value of the make/break current for computing the actual contactor wear at the operation 730. The wear coefficient is therefore identified with the current recovered from the log and the wear increment due to the current recovered from the log is then computed.

In examples, after the computation of the actual wear $W_N$ of the contactor, the computed actual wear $W_N$ is compared 740 to a parameterizable threshold to determine if the actual wear $W_N$ of the contactor exceeds an acceptable level. The threshold is parameterizable as it may depends on the robustness of the contactor during current make/break operations at a given voltage. FIG. 6 illustrates different wear severity thresholds that have been defined for different current ranges.

If the actual wear of the contactor exceeds 740 an acceptable level, then a contactor wear alarm may be issued. When the alarm is issued, the system handling this alarm may automatically decide to prevent any further operation of the contactor in order to avoid an irremediable damage of the electrical system.

Exceeding the threshold may be interpreted as meaning that the value of $W_N$ is greater than or equal to the value of the threshold, or is greater than the value of the threshold.

If the actual wear of the contactor has an acceptable level, i.e. it does not exceed the threshold that represents a damaged or possibly damaged contactor, it may be determined whether the contactor opened or closed under load. It is the power (current and voltage) involved in an event (opening, closing) that determines the wear of the contactor. The power that is involved during a state change degrades the condition of the contactor. If a contactor state change stopped current from flowing or allowed current to flow— e.g. 1. was in a closed state and then opened, —e.g. 2 in the event of a system with multiple contactors in the circuit, the contactor opened a closed circuit, the actual wear $W_N$ may be stored in the data storage memory as the computed wear affects the contactor. On the contrary, if the contactor did not open or close under load the contactor terminals sustain less damage, the actual wear $W_N$ is small; the wear increment just has a mechanical component.

Examples of the method have been discussed in reference to FIG. 2. The discussed examples may be combined. For the sake of explanation only, it is now briefly discussed the combination of examples represented on FIG. 2. It is to be understood that the method of the invention is not limited to the particular example of FIG. 2.

After the method is triggered, for instance when the electrical system is started, the last known wear value $W_{N-1}$ of the contactor is loaded 702 from a non-volatile data storage memory. The system that executes the method is now ready to acquire 704 states of the electrical system contactors, e.g. the system sends contactor states to a computer program that executes the method. While the method is ready to acquire states of the electrical system, the current and the status of the contactors are measured at the same frequency 706 for forming a log of the number of contactor operations associated with ranges of currents in a non-volatile memory. The voltage on the battery of the ESS is also measured at a frequency equal to the frequency of the current and the measures are stored 708 for forming a log of the number of contactor operations associated with ranges of currents in a non-volatile memory. Both logs are continuously performed. When a change of state of the contactor is detected 710, for instance on contactor's auxiliary contacts, the method detects whether a current break occurred 720. If this is not the case, the current flowing through the closed contactor will be used 726 for computing the wear coefficient. It is to be understood that there are two or more contactors in series and a contactor opens second since the circuit is already open there is no wear due to current being made/broken; in this case the wear coefficient is use due to mechanical action. If a current break occurred, the last measured current flowing through the opened contactor will be recovered 722 from the log of measured currents. A wear increment $W_I$ of the contactor is computed 724, 726 after the identification of a wear coefficient. The wear increment is scaled 728 based on the battery voltage, e.g. the voltage of the battery is recovered from the log battery voltage in order to obtain the battery voltage at the time the contactor change was detected. Then, the contactor value $W_{N-1}$ is increment 730 with the new wear increment $W_I$. If the actual wear $W_N$ has a value that excess a threshold 740, an alarm is raised 742 so that the ESS is aware that the contactor is damaged or at least likely to be damaged. The electrical system (the ESS) typically will avoid any further use of the contactor until the contactor has been replaced. The actual wear $W_N$ is stored on the data storage memory. If the contactor is still in condition to be operated 740, the power broken/made by the contactor operation (if any) on the contactor is taken into account to decide whether or not to store the actual wear $W_N$ into the data storage memory; the actual wear $W_N$ can be compared with several severity thresholds that are at least parameterizable with the measured current (722, 726) and if the no threshold is excessed, the power broken/made by the contactor operation does not trigger a replacement of the former wear $W_{N-1}$ by the actual wear $W_N$.

The examples of the method have been discussed for a contactor. It is to be understood that the method can be used with a system having one or more contactors. In this situation, an actual wear $W_N$ is maintained for each contactor of the system.

Figure 3:
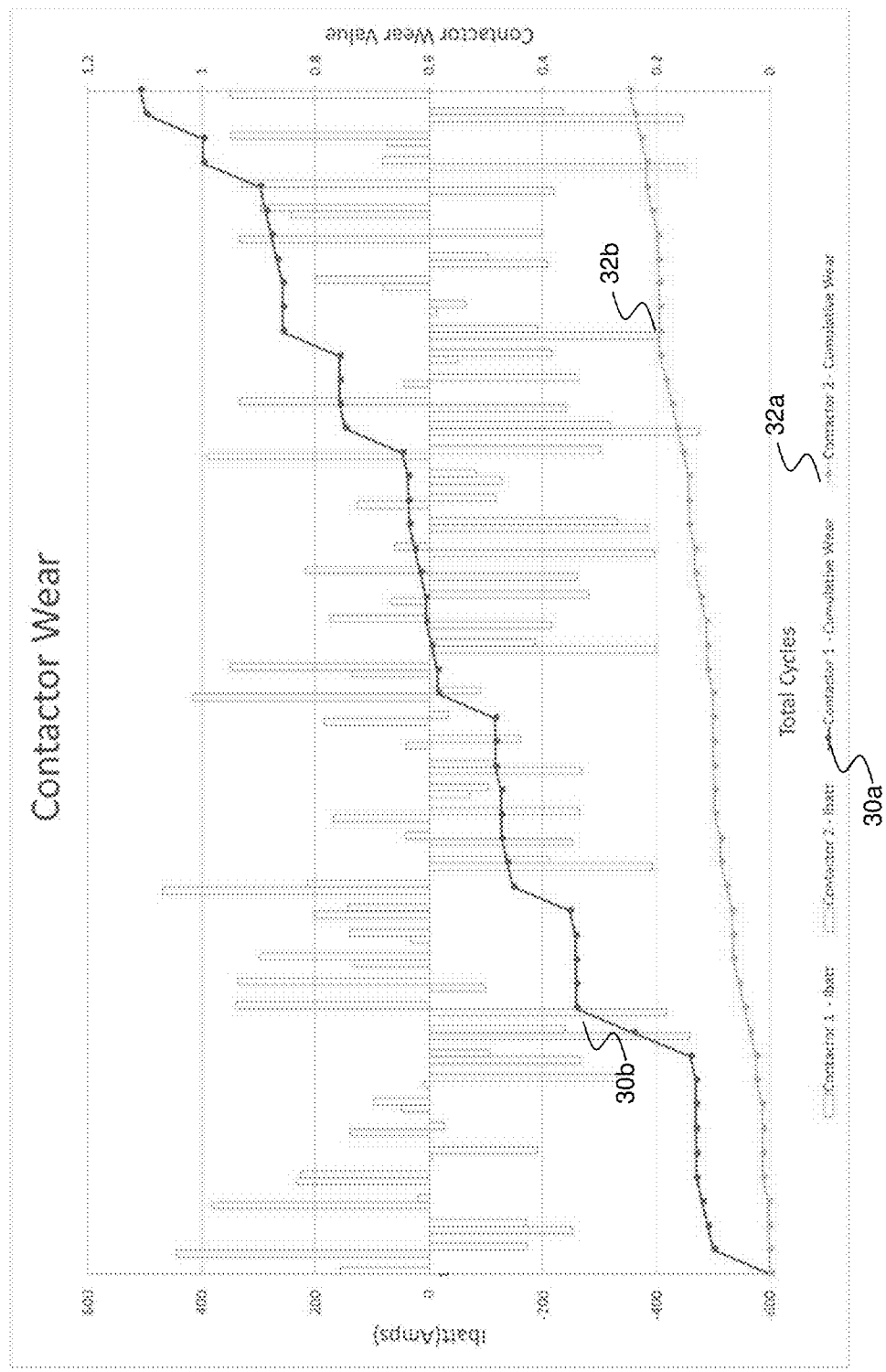
FIG. 3 shows contactor wear graph for two identical contactors over 50 cycles with different current profiles.
Figure 4:
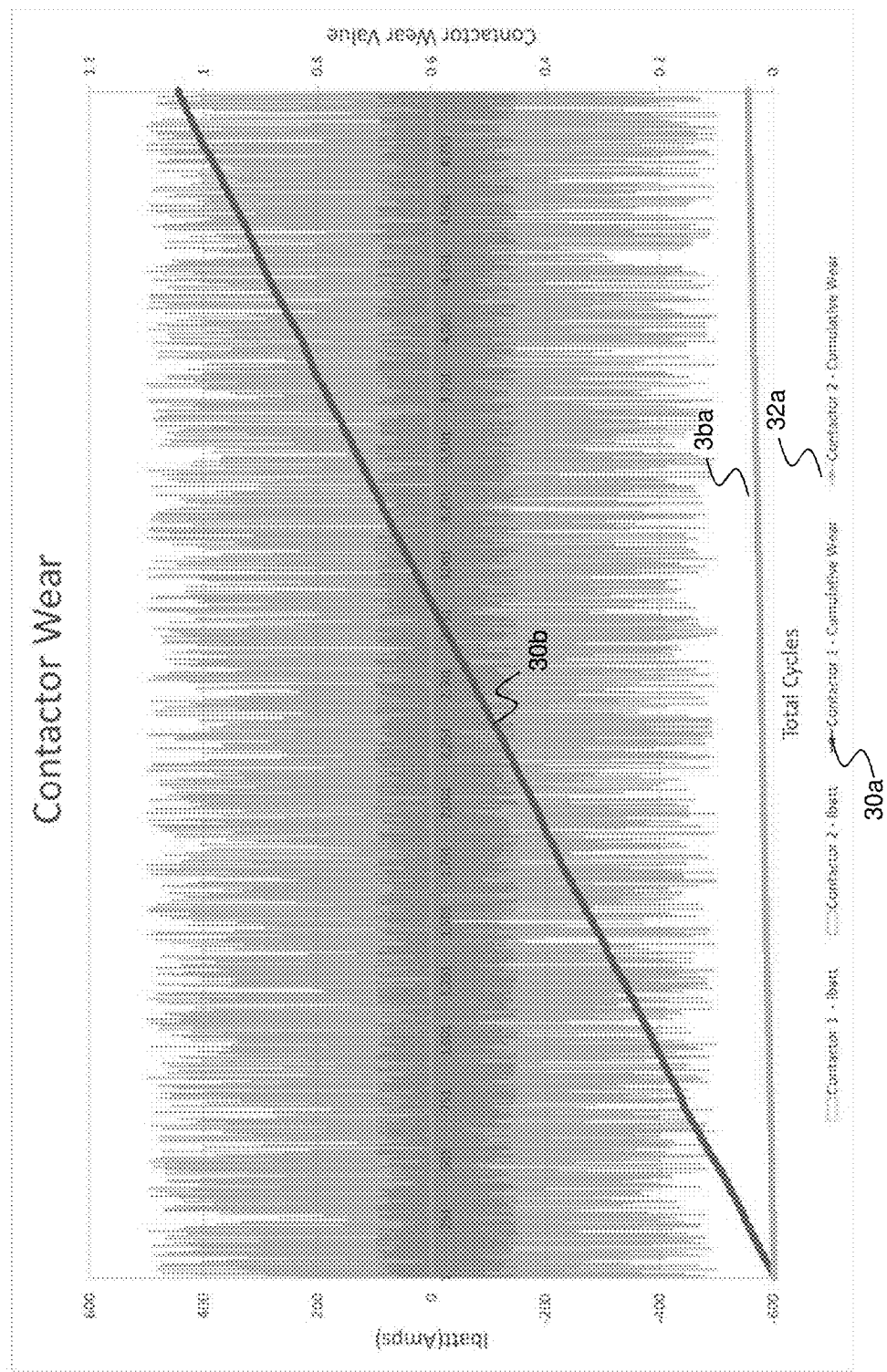
FIG. 4 shows an example of contactor wear graph for two identical contactors over 5000 cycles with different current profiles.

Referring now to FIGS. 3 and 4, examples of contactor wear graph for two identical contactors with different current profiles 30a, 32b are represented. In these figures, the bars represent current break or making cycles of differing values. The lines 30b, 32b represents the cumulative contactor wear resulting from these cycles. The line 30b represent the cumulative wear of current with higher magnitude, while the line 32b represent the cumulative wear of current lower magnitude. The cumulative wear of the line 32b is slowly increasing compared to the line 30b as the magnitude of the current breaks are with lower magnitudes.

Figure 1:
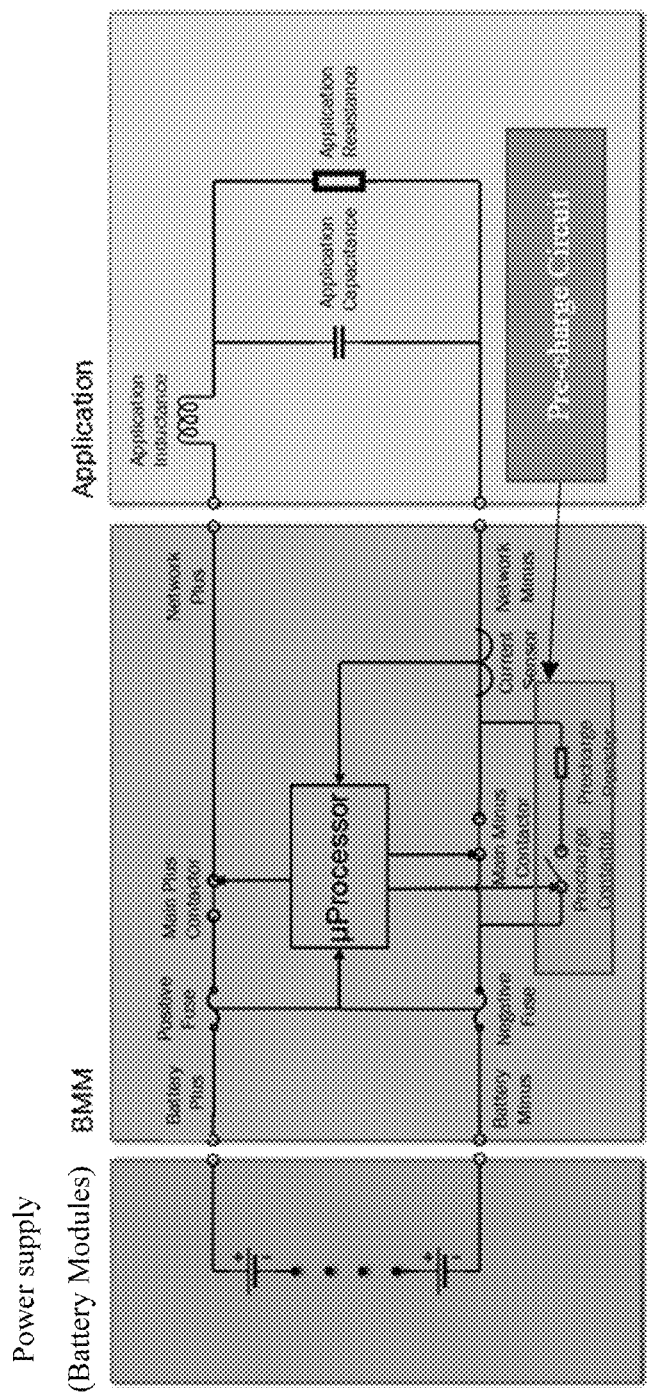
FIG. 1 illustrates an example of an electrically energized system.

FIG. 1 is an example of an ESS (that can be referred to as electrical system) that comprises a battery comprising energy storage modules, a battery management system including a BMS, and an application load. The BMS is connected to positive and negative connectors of the battery, and it may comprise a pre-charge circuit with a contactor and a dissipative energy component. The BMM further comprises two outputs connectors, a positive and a negative one. An application load is connected on these two outputs connectors. The BMS may also comprise one or more fusible elements that can act to protect the system from overcurrent fault conditions. The purpose of the positive BMM line is to connect the positive battery connection to the positive terminal of the application. Similarly, the purpose of the negative BMM line is to connect the negative battery connection to the negative terminal of the application. The BMM further comprises two contractors, one being on the positive line of the BMM and the other one on the negative line. The BMM also comprises a processing unit (referred as microprocessor on FIG. 1) communicatively coupled to a memory that stores instructions to perform at least one example previously discussed. In the example of FIG. 1, the BMM may be communicatively coupled with the fuses of the positive and negative lines, e.g. the processing unit may be informed that one or more fuses are open. Still in the example of FIG. 1, the contactors on the positive and negative lines are also communicatively coupled with the processing unit that is able to open or close these positive and negative contactors; the charge process of the load by the battery can be controlled with these contactors. The BMM may also be communicatively coupled with a pre-charge contactor of the pre-charge circuit, and it can control the pre-charge process with this contactor. In the example of FIG. 1, the BMM also comprises a probe for measuring the current flowing though one of the lines of the BMM (here the negative line). The probe can be also referred as a current sensor. The probe thus provides the computing unit with the information relative to the current flowing through the main minus contactor and the main plus contactor if the main minus contactor is closed. The instructions stored on the memory configure the processor to open and/or close the contactor on the positive and/or negative lines. It is to be understood that the opening and closing of these contactors is performed as known in the art.

The BMM/BMS is a computerized device suitably designed for implementing examples of the present invention as described herein. In that respect, it may be appreciated that the methods described herein are largely non-interactive and automated. In exemplary embodiments, the methods described herein may be implemented either in an interactive, partly-interactive or non-interactive system. The methods described herein may be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of the methods of FIG. 1 may be implemented in software, as an executable program, the latter executed by suitable digital processing devices. More generally, embodiments of the present invention may be implemented wherein general-purpose digital computers, such as personal computers, workstations, etc., are used.

Figure 7:
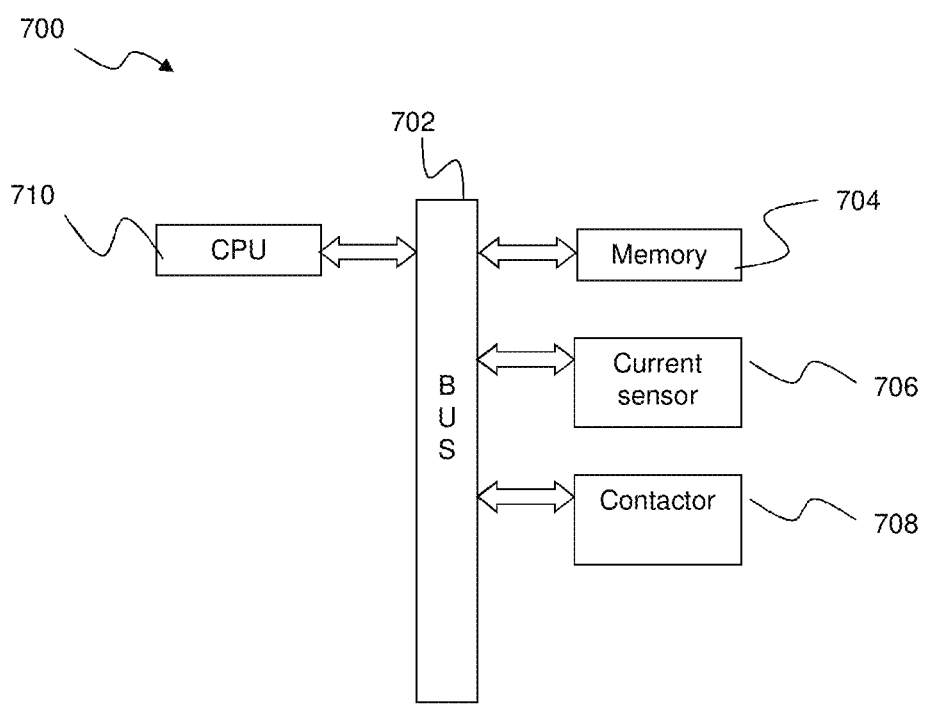
FIG. 7 shows an example of a controller of an electrically energized system.

For instance, the BMS/BMM system depicted in FIG. 1 schematically represents a computerized unit, e.g., a general-purpose computer. In exemplary embodiments, in terms of hardware architecture, as shown in FIG. 7, the unit 700 includes a processor 710, memory 704 coupled to a input/output controller 702 (referred as BUS on FIG. 7), and one or more input and/or output (I/O) devices 706, 708 (a current sensor, a contactor . . . ) that are communicatively coupled via a local input/output bus 702. Further, the input/output controller 702 may be, but is not limited to, one or more buses or other wired or wireless connections, as is known in the art. The input/output controller 702 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 710 is a hardware device for executing software, particularly that stored in memory 704. The processor 710 may be any custom made or commercially available processor, a central processing unit (CPU), an auxiliary processor among several processors associated with the system 700, a semiconductor based microprocessor (in the form of a microchip or chip set), or generally any device for executing software instructions.

The memory 704 may include any one or combination of volatile memory elements (e.g., random access memory) and nonvolatile memory elements. Moreover, the memory 704 may incorporate electronic, magnetic, optical, and/or other types of storage media. Note that the memory 704 may have a distributed architecture, where various components are situated remote from one another, but may be accessed by the processor 710.

The software in memory 704 may include one or more separate programs, each of which comprises an ordered listing of executable instructions for implementing logical functions. In the example of FIG. 7, the software in the memory 704 includes a method described herein in accordance with examples and a suitable operating system (OS). The OS essentially controls the execution of other computer programs, it being noted that methods described herein (e.g. FIG. 2) may be partly implemented as application program, and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 704, so as to operate properly in connection with the OS. Furthermore, the methods may be written as an object-oriented programming language, which has classes of data and methods, or a procedure programming language, which has routines, subroutines, and/or functions.

Possibly, a conventional keyboard and mouse may be coupled to the input/output controller. Other I/O devices may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 702 for further processing. Sensor nodes are ideally small, consume low energy, are autonomous and operate unattended.

In addition, the I/O devices may further include devices that communicate both inputs and outputs. The system 700 may further include a display controller coupled to a display. In exemplary embodiments, the system may further include a network interface or transceiver for coupling to a network.

The network transmits and receives data between the unit 700 and external systems. The network is possibly implemented in a wireless fashion, e.g., using wireless protocols and technologies, such as WiFi, WiMax, etc. The network may be a fixed wireless network, a wireless local area network (LAN), a wireless wide area network (WAN) a personal area network (PAN), a virtual private network (VPN), intranet or other suitable network system and includes equipment for receiving and transmitting signals.

The network may also be an IP-based network for communication between the unit 700 and any external server, client and the like via a broadband connection. In exemplary embodiments, network may be a managed IP network administered by a service provider. Besides, the network may be a packet-switched network such as a LAN, WAN, Internet network, etc.

When the unit 700 is in operation, the processor 710 is configured to execute software stored within the memory 704, to communicate data to and from the memory 704, and to generally control operations of the computer 700 pursuant to the software. The method described herein and the OS, in whole or in part are read by the processor 710, typically buffered within the processor 704, and then executed. When the methods described herein (e.g. with reference to FIG. 1) are implemented in software, the methods may be stored on any computer readable medium for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects. Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the unit 700, partly thereon, partly on a unit 700 and another unit 700, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams may be implemented by one or more computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved and algorithm optimization. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims. For instance, the former known wear $W_{N-1}$ may initialized and may thus represent a value of cumulative wear of the contactor; the computation of the actual wear $W_N$ is thus an updated value of the known cumulative wear by adding the computed wear increment $W_I$ the initialized former known wear $W_{N-1}$.

What is claimed:

1. A computer-implemented method for estimating a degradation of an electronically controlled electro-mechanical switch, comprising:
   determining a change of state of a contactor;
   for each determined change of state, computing a wear increment $W_I$ of the contactor by:
      identifying a wear coefficient using a mapping between a last measured current through the contactor and a current range associated with a given wear coefficient;
      computing an actual wear $W_N$ of the contactor by adding the computed wear increment $W_I$ to a former known wear $W_{N-1}$ of the contactor;
      comparing the computed actual wear $W_N$ to a parameterizable threshold to determine if the actual wear $W_N$ of the contactor exceeds an acceptable level;
      determining that the actual wear $W_N$ of the contactor exceeds an acceptable level; and
      raising a contactor wear alarm.

2. The method of claim 1, wherein determining a change of state of the contactor further comprises:
   detecting that a current change through the contactor occurred.

3. The method of claim 2, wherein determining a change of state of the contactor further comprises:
   periodically monitoring the current through the contactor, thus forming a set of records of the current through the contactor.

4. The method of claim 3, further comprising:
   when a change of state is detected, determining from the set of records of current whether a current change through the contactor occurred;
   if a current change through the contactor occurred, recovering the last measured current through the contactor from the set of records of the current; and
   if no current change through the contactor occurred, determining that the wear coefficient is due to the mechanical operation of the contactor.

5. The method of claim 1, further comprising:
   scaling the identified wear coefficient using a voltage across a power source.

6. The method of claim 1, further comprising:
   before computing the actual wear $W_N$, retrieving the former known wear $W_{N-1}$ from a memory; and
   after computing the actual wear $W_N$, storing the actual wear $W_N$ in the memory.

7. The method of claim 1, further comprising:
   if the actual wear $W_N$ of the contactor has an acceptable level, determining whether a contactor operation broke/made current occurred for the contactor:
   if the contactor operation broken/made current, determining the wear coefficient; or
   if the contactor operation did not break/make current, determining that the wear coefficient is due to the mechanical operation of the contactor.

8. A contactor management system for estimating a degradation of an electronically controlled electro-mechanical switch, comprising:
   a contactor connectable to a power supply;
   a processor operatively coupled to a data storage memory, the processor being connected to the contactor, the data storage memory comprising instructions to configure the processor to:
      determine a change of state of the contactor;
      for each determined change of state, compute a wear increment $W_I$ of the contactor by:
      identify a wear coefficient using a mapping between a last measured current through the contactor and a current range associated with a given wear coefficient;
      compute an actual wear $W_N$ of the contactor by adding the computed wear increment $W_I$ to a former known wear $W_{N-1}$ of the contactor;
      before computing the actual wear $W_N$, retrieve the former known wear $W_{N-1}$ from the data storage memory;
      after computing the actual wear $W_N$, store the actual wear $W_N$ in the data storage memory;
      compare the computed actual wear $W_N$ to a parameterizable threshold to determine if the actual wear $W_N$ of the contactor exceeds an acceptable level;
      determine that the actual wear $W_N$ of the contactor exceeds an acceptable level; and
      if the actual wear $W_N$ of the contactor exceeds an acceptable level, raise a contactor wear alarm.

9. The contactor management system of claim 8, further comprising instructions to configure the processor to detect that a current change through the contactor occurred.

10. The contactor management system of claim 9, further comprising a sensor for monitoring a current through the contactor and wherein the instructions further comprise instructions to configure the processor to:
    periodically obtain values of the current through the contactor and form a set of records of the current through the contactor.

11. The contactor management system of claim 10, further comprising instructions to configure the processor to:
    when a change of state is detected, determine from the set of records of current whether a current change through the contactor occurred;
    if a current change through the contactor occurred, recover the last measured current through the contactor from the set of records of the current; and
    if no current change through the contactor occurred, determine that the wear coefficient is due to the mechanical operation of the contactor.

12. The contactor management system of claim 8, further comprising instructions to configure the processor to:
scale the identified wear coefficient using a voltage across the contactor.

13. The contactor management system of claim 8, further comprising instructions to configure the processor to:
if the actual wear $W_N$ of the contactor has an acceptable level, determine whether a contactor operation broke/made current occurred for the contactor:
if the contactor operation broke/made current, determine the wear coefficient using the mapping; or
if the contactor did not break/make current, determine a wear coefficient the wear coefficient is due to the mechanical operation.

14. A non-transitory computer-readable data storage medium comprising instructions causing a computer to:
determine a change of state of the contactor;
for each determined change of state, compute a wear increment $W_I$ of the contactor by:
identify a wear coefficient using a mapping between a last measured current through the contactor and a current range associated with a given wear coefficient;
compute an actual wear $W_N$ of the contactor by adding the computed wear increment $W_I$ to a former known wear $W_{N-1}$ of the contactor;
periodically monitor the current through the contactor, thus forming a set of records of the current through the contactor;
when a change of state is detected, determine from the set of records of current whether a current change through the contactor occurred;
if a current change through the contactor occurred, recover the last measured current through the contactor from the set of records of the current; and
if no current change through the contactor occurred, determine that the wear coefficient is due to the mechanical operation of the contactor;
compare the computed actual wear $W_N$ to a parameterizable threshold to determine if the actual wear $W_N$ of the contactor exceeds an acceptable level; and
if the actual wear $W_N$ of the contactor exceeds an acceptable level, raise a contactor wear alarm.

15. The non-transitory computer-readable data storage medium of claim 14, wherein causing the computer to determine the change of state of the contactor comprises detecting whether a current change through the contactor occurred.

* * * * *